United States Patent [19]

Robinson et al.

[11] 4,352,836
[45] Oct. 5, 1982

[54] METHOD FOR OBTAINING AN ABRASIVE COATING

[75] Inventors: John W. Robinson, Levittown, Pa.; Grzegorz Kaganowicz, Princeton, N.J.

[73] Assignee: RCA Corporation, New York, N.Y.

[21] Appl. No.: 255,399

[22] Filed: Apr. 20, 1981

[51] Int. Cl.³ .................... B05D 5/02; E05D 15/10
[52] U.S. Cl. ........................ 427/39; 51/209 DL
[58] Field of Search .................. 427/38, 39, 40; 51/209 DL, 209 R, 394, 407

[56] References Cited

U.S. PATENT DOCUMENTS 4,104,832  8/1978  Keizer .......................... 51/281 R
4,260,647  4/1981  Wang et al. ..................... 427/40
4,282,268  8/1981  Priestley et al. ................. 427/40

OTHER PUBLICATIONS

Joyce et al., "Silicon Oxide and Nitride Films Deposited by an R.F. Glow-Discharge," *Thin Solid Films*, vol. 1, pp. 481-494 (1967/1968).

Primary Examiner—John H. Newsome
Attorney, Agent, or Firm—Birgit E. Morris

[57] ABSTRACT

A method of preparing an abrasive silicon oxide coating on a substrate which includes glow discharging silane and $N_2O$ in the presence of a substrate whereby a first silicon oxide layer having a refractive index of between about 1.0 and 1.2 as measured by ellipsometry is deposited. A second silicon oxide layer having a refractive index of between about 1.30 and 1.48 as measured by ellipsometry is glow discharge deposited onto the first layer.

10 Claims, 1 Drawing Figure

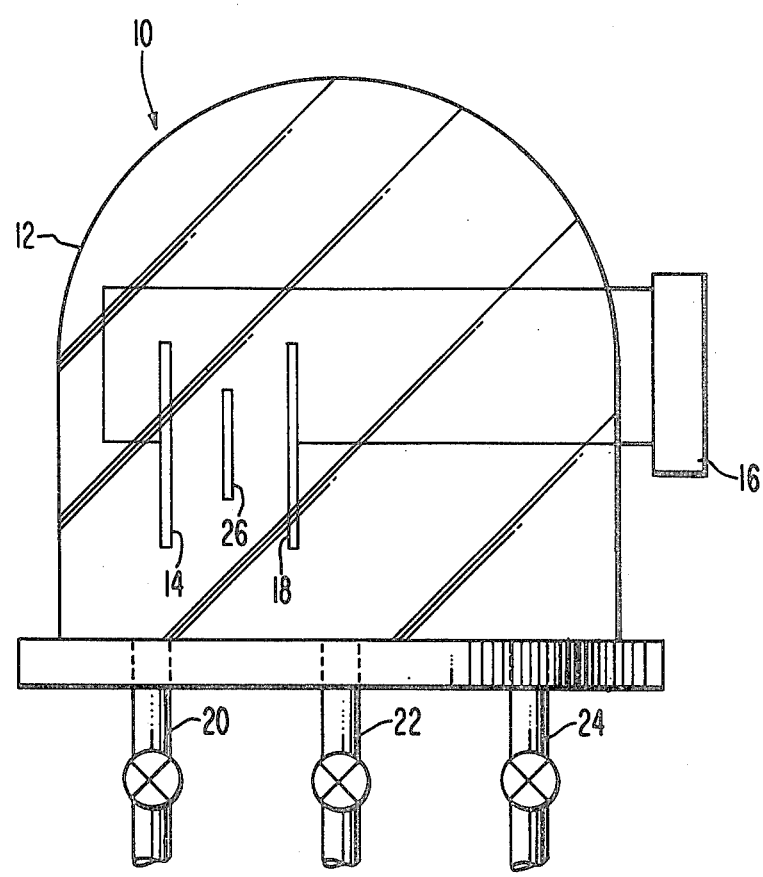

METHOD FOR OBTAINING AN ABRASIVE COATING

This invention relates to a method of preparing an abrasive coating on a substrate. More particularly, this invention relates to a method of preparing an abrasive coating by a glow discharge deposition technique.

BACKGROUND OF THE INVENTION

Kaganowicz in a copending application entitled, "METHOD FOR PREPARING AN ABRASIVE COATING", Ser. No. 963,819, filed Nov. 27, 1978, discloses a method for preparing an abrasive silicon oxide coating ($SiO_x$, wherein $1 \leq x \leq 2$) on a substrate based on glow discharge deposition from starting materials including silane and a gaseous, oxygen-containing compound selected from the group consisting of $N_2O$, $H_2O$, and $CO_2$. These $SiO_x$ coatings are sufficiently abrasive to be employed in the lapping of a diamond playback stylus. However, a more abrasive coating which would decrease lapping time would be desirable.

SUMMARY OF THE INVENTION

We have found a method for preparing a $SiO_x$ abrasive coating, wherein $1 \leq x \leq 2$, on a substrate. The method includes the steps of subjecting $N_2O$ and $SiH_4$ to a glow discharge, depositing a first $SiO_x$ layer, having a refractive index as measured by ellipsometry of between about 1.0 and 1.2, onto the substrate and depositing a second $SiO_x$ layer, having a refractive index as measured by ellipsometry of between about 1.30 and 1.48, onto the first $SiO_x$ layer.

BRIEF DESCRIPTION OF THE FIGURE

The FIGURE is a cross-sectional view of an apparatus suitable for depositing the abrasive coating.

DETAILED DESCRIPTION OF THE INVENTION

The abrasive silicon oxide ($SiO_x$) material of the instant invention may be viewed as a mixture of SiO and $SiO_2$. It is prepared by first evacuating a vacuum chamber containing a suitable substrate to about $10^{-5}$ torr. $N_2O$ is introduced and silane ($SiH_4$) is then added. The $SiO_x$ coating is prepared by the glow discharge method in which a plasma is formed as a result of the decomposition of the $N_2O$ and $SiH_4$ starting materials in an electromagnetic field. The resulting product is deposited on the substrate.

The partial pressure of the gaseous oxygen source is generally in the range of 30-35 micrometers of mercury. It has been found that, for example, when higher pressures of $N_2O$ are employed, for example, 60-80 or more micrometers of mercury, the resulting coatings are powdery. However, these coatings deposit on the substrate at considerably faster rates than at lower pressures. The powdery coatings do not adhere to the substrate so are not suitable for lapping hard materials such as diamond. Thus, in a second pass over a powdery $SiO_x$ coated substrate no lapping occurred. These powdery coatings have a refractive index (n) as measured by ellipsometry of between about 1.0 and 1.2. These values are surprising since the refractive indexes of SiO and $SiO_2$ are 2.0 and 1.46, respectively. The reason for the observed index of refraction may be explained by the method of measurement and the nature of the coating.

The refractive index and thickness of the coatings can be measured by ellipsometry. Ellipsometry requires, for an accurate determination of these parameters, a single reflection of monochromatic light from a reflecting surface overcoated with a transparent coating whose thickness and refractive index are to be determined. The powdery coating has clumps of bush-like $SiO_2$ protruding from it. The incident monochromatic light employed during the ellipsometric measurement is scattered by the clumps in the powdery coating which results in multiple reflections. The multiple reflections yield results which make the coating appear thicker and more transparent than it is. Although the ellipsometer measurement is erroneous, it is consistent and reproducible. The measurements can detect relatively small changes in the thickness of the powdery coating.

We have found that if the powdery material is deposited first using higher pressures of $N_2O$ followed by deposition of $SiO_x$ in which, for example, the partial pressure of $N_2O$ is about 30 to 35 micrometers of mercury, the final product is more abrasive than, for example, an entire coating deposited in the 30 to 35 micrometers of mercury range for the $N_2O$. The second $SiO_x$ layer deposited upon the first $SiO_x$ layer has a refractive index as measured by ellipsometry of between about 1.30 and 1.48.

A surprising result for the two layer $SiO_x$ coating is its enhanced abrasiveness. The $SiO_x$ abrasive coating may be deposited on any suitable substrate such as plastic, metal, glass, and the like. Materials such as diamond, sapphire and the like may be lapped using this abrasive coating. A preferred substrate for lapping diamond styli is a disc of a vinyl chloride homopolymer or copolymer. The vinyl substrate may be coated with one or more metal layers such as copper, Inconel and the like.

The actual thickness of the first and second $SiO_x$ layers preferably are in the ratio of between about 1:1 and 3:1. A $SiO_x$ coating total thickness of about 1,500 angstroms has been found to be effective.

Infrared analysis of the $SiO_x$ coatings prepared by the present method indicates that x is close to 2; that is, if $SiO_x$ is considered to be a mixture of SiO and $SiO_2$, the coating is rich in $SiO_2$ with SiO present in about 10-15 percent.

Kaganowicz et al. in a copending application, "A METHOD FOR PREPARING AN ABRASIVE LAPPING DISC," Ser. No. 229,150, filed Jan. 28, 1981, discloses a method for preparing a plastic lapping disc with an abrasive silicon oxide layer. A first major surface of the plastic disc is substantially covered during the glow discharge deposition. This method may be employed with the present invention.

The invention will be further described by reference to the FIGURE.

A glow discharge apparatus suitable for preparing the abrasive material is shown in the FIGURE generally as 10. The glow discharge apparatus 10 includes a vacuum chamber 12 which can be a glass bell jar. In the vacuum chamber 12 are two electrodes 14 and 18 which can be a screen, coil, or plate of a material that is a good electrical conductor and does not readily sputter, such as aluminum. The electrodes 14 and 18 are connected to an internal power supply 16 which may be DC or AC to obtain a voltage potential between the electrodes 14 and 18. The plasma may be enhanced by means of magnets on the electrodes 14 and 18. An outlet 20 into the vacuum chamber 12 allows for evacuation of the system and is connected to a mechanical pump, not shown. A first inlet 22 and a second inlet 24 are connected to gas bleed systems, not shown, for adding the reactants employed to prepare the abrasive material.

In carrying out the process a substrate 26 to be coated is placed between the electrodes 14 and 18, typically maintained about 5 to 10 centimeters apart. The vacuum chamber 12 is then evacuated through the outlet 20 to a pressure of about $0.5-1 \times 10^{-5}$ torr. $N_2O$ is added through the first inlet 22 to its desired partial pressure. $SiH_4$ is added through the second inlet 24 until the desired partial pressure ratio of $SiH_4$ to $N_2O$ is obtained. A preferred ratio is about 1:6.

In order to begin deposition of an abrasive coating on the substrate 26 a glow discharge is initiated between the electrodes 14 and 18 by energizing the power source 16. For deposition the current should be in the range of about 200 to 900 milliamps, preferably 400 to 700 milliamps. Any convenient frequency such as 10 kilohertz or a radio frequency may be employed. The potential between electrodes 14 and 18 is generally about 1,000 volts.

One application of the instant abrasive coating is in the shaping of a playback stylus for use with capacitive information records. A method for producing suitable styli was described in Keizer, U.S. Pat. No. 4,104,832. The keel of the stylus is shaped by means of a coarse-pitched, deep groove in a disc. The disc groove is coated with an abrasive $SiO_x$ coating of the instant invention.

The invention will be further illustrated by the following Example but it is to be understood that the invention is not meant to be limited by the details described therein.

EXAMPLE

A 30.5 centimeter diameter vinyl chloride homopolymer disc containing a spiral groove in a major surface and coated with a metal bilayer comprising a copper layer about 50 angstroms thick and a 200 angstrom thick layer of Inconel 600 (76.8 atom percent nickel, 13.8 atomic percent chromium, 8.5 atom percent iron) was placed in a 46 centimeter by 76 centimeter bell jar as described in the FIGURE which was then evacuated to $1 \times 10^{-5}$ torr. $N_2O$ was added to a partial pressure of 133 micrometers of mercury using a flow of 7.0 standard cubic centimeters per minute (sccm). $SiH_4$ was then added to a total partial pressure of 21 micrometers of mercury. The partial pressure ratio of $SiH_4$ to $N_2O$ was about 1:6.

The disc substrate was rotated at a rate of 30 revolutions per minute (rpm) between two 15 centimeter by 15 centimeter aluminum electrodes. These electrodes covered a strip approximately 6 centimeters wide on the disc. To create a glow discharge between the electrodes, 500 milliamps of current was supplied to the electrodes with a potential of about 1,000 volts at 10 kilohertz. Deposition of a $SiO_x$ coating onto the disc started which was continued for two minutes. The layer was powdery with an observed refractive index of 1.05 and an observed thickness of about 2,600 angstroms measured by ellipsometry using a Rudolf Research Ellipsometer. The actual thickness was estimated to be about 500 angstroms.

The flow of $N_2O$ and $SiH_4$ was stopped by closing the first inlet 22 and the second inlet 24, and the remaining gases in the vacuum chamber were pumped off. $N_2O$ was added to a partial pressure of 32 micrometers of mercury at a flow rate of 34.0 sccm. $SiH_4$ was then added such that its partial pressure was 5 micrometers of mercury at a flow rate of 4.1 sccm. The partial pressure ratio of $SiH_4$ to $N_2O$ was about 1:6.

The glow discharge procedure was then repeated and continued for eight minutes. The newly deposited material was about 900 angstroms thick and had a refractive index of 1.4155 measured by ellipsometry. The total $SiO_x$ coating thickness was 1,417 angstroms with a refractive index of 1.1142.

A number of playback styli having diamond dielectric support elements were keel lapped over the same grooves which included lapping of the apex of a pyramidal shaped diamond support element by the flat bottom groove surface of the $SiO_x$ coated lapping disc to form a shoe. The $SiO_x$ coating was thick enough to prevent penetration of the stylus tip to the substrate. Each stylus was lapped for two minutes over the same grooves and the shoe length of each stylus was then measured. The results are shown in Table 1.

TABLE I

| Stylus Sample Number | Stylus Shoe Length (Micrometers) |
|---|---|
| 1 | 6.0 |
| 2 | 5.25 |
| 3 | 4.75 |
| 4 | 4.0 |

The total shoe length lapped for these four samples was 20.0 micrometers. The estimated amount of material removed is related to the shoe length by taking the shoe length to the third power (i.e., 8,000 cubic micrometers).

CONTROL

The experimental and test conditions were repeated as in the Example except that only one deposition of $SiO_x$ was performed using a partial pressure of $N_2O$ of 32 micrometers of mercury at a flow rate of 34.0 sccm and a partial pressure $SiH_4$ of 5 micrometers of mercury at a flow rate of 4.1 sccm. The partial pressure ratio of $SiH_4$ to $N_2O$ was about 1:6. Results of keel lapping diamond styli using the resulting $SiO_x$ coated substrate are shown in Table II. The $SiO_x$ coating was 764 angstroms thick and had a refractive index of 1.4491.

TABLE II

| Stylus Sample Number | Stylus Shoe Length (Micrometers) |
|---|---|
| 1 | 5.25 |
| 2 | 3.5 |
| 3 | 3.5 |
| 4 | 3.0 |

The total shoe length lapped for the four samples was 15.25 micrometers so the amount of diamond material removed was 3,546 cubic micrometers.

In comparing the total amount of diamond removed during lapping, the ratio between the values in the Example and the values in the Control is about 2.25:1. Thus, more than twice the material is removed for the same lapping time using the instant invention.

We claim:

1. A method for preparing a silicon oxide ($SiO_x$) abrasive coating, wherein $1 \leq x \leq 2$, on a substrate comprising the steps of:
   subjecting $N_2O$ and $SiH_4$ to a glow discharge;
   depositing a first $SiO_x$ layer having a refractive index as measured by ellipsometry of between about 1.0 and 1.2 onto the substrate; and depositing a second $SiO_x$ layer having a refractive index as measured by ellipsometry of between about 1.30 and 1.48 onto the first $SiO_x$ layer.

2. A method in accordance with claim 1 wherein the partial pressure ratio of $SiH_4$ to $N_2O$ during deposition of the first $SiO_x$ layer is about 1:6.

3. A method in accordance with claim 1 wherein the partial pressure ratio of $SiH_4$ to $N_2O$ during deposition of the second $SiO_x$ layer is about 1:6.

4. A method in accordance with claim 1 wherein the ratio of the thickness of the first $SiO_x$ layer to the thickness of the second $SiO_x$ layer is between about 1:1 and 3:1.

5. A method in accordance with claim 1 herein the substrate is a homopolymer or copolymer of vinyl chloride.

6. A method in accordance with claim 5 wherein the substrate is coated with a metal layer.

7. A method in accordance with claim 1 wherein the partial pressure of $N_2O$ for the deposition of the first $SiO_x$ layer is at least about 60 micrometers of mercury.

8. A method in accordance with claim 7 wherein the partial pressure of $N_2O$ is about 133 micrometers of mercury.

9. A method in accordance with claim 1 wherein the partial pressure of $N_2O$ for the deposition of the second $SiO_x$ layer is about 30–35 micrometers of mercury.

10. A method in accordance with claim 1 wherein the total thickness of the $SiO_x$ coating is about 1,500 angstroms.

* * * * *